United States Patent [19]

Naitoh

[11] Patent Number: 5,858,257

[45] Date of Patent: Jan. 12, 1999

[54] METHOD FOR WET ETCHING AND DEVICE USED THEREIN

[75] Inventor: Yoshiyuki Naitoh, Moriyama, Japan

[73] Assignee: International Business Machines Corporation, Armonk, N.Y.

[21] Appl. No.: 745,583

[22] Filed: Nov. 7, 1996

[30] Foreign Application Priority Data

Nov. 28, 1995 [JP] Japan ...................................... 7-308658

[51] Int. Cl.$^6$ ........................................................ C23F 1/00
[52] U.S. Cl. .............................. 216/92; 438/750; 438/754
[58] Field of Search ............................... 216/92; 438/750, 438/754

[56] References Cited

U.S. PATENT DOCUMENTS

| | | | |
|---|---|---|---|
| 5,002,627 | 3/1991 | Scheithauer et al. | 216/92 |
| 5,378,308 | 1/1995 | Thoms | 216/92 |
| 5,436,201 | 7/1995 | Chi et al. | 438/750 |
| 5,445,986 | 8/1995 | Hirota | 438/754 |
| 5,547,896 | 8/1996 | Linn et al. | 438/750 |

FOREIGN PATENT DOCUMENTS

| | | |
|---|---|---|
| 63-153889 | 6/1988 | Japan . |
| 04-066480 | 2/1990 | Japan . |
| 07-022383 | 7/1995 | Japan . |

*Primary Examiner*—Deborah Jones
*Attorney, Agent, or Firm*—Richard M. Goldman

[57] ABSTRACT

A method of preventing the occurrence of side etch in a wet etching method to form a circuit layer which meets the requirement of a high circuit density. First, etching is partially done using etchant having a relatively high etching rate with a spray pressure of a relatively small value, then etching is carried out using a second etchant having a relatively low etching rate with a high spray pressure. In an optional finishing step, etchant containing abrasive is used.

13 Claims, 4 Drawing Sheets

METHOD FOR WET ETCHING AND DEVICE USED THEREIN

FIELD OF THE INVENTION

This invention relates to circuitization of printed circuit boards, and more particularly to an etching method by which a metal layer on the printed circuit board is patterned to a desired circuit pattern. This invention specifically relates to an etching method for forming a high-density circuit pattern metal layer, by preventing the occurrence of side etching.

BACKGROUND OF THE INVENTION

In the field of printed circuit boards, a patterned metal layer is formed on a printed circuit board to ensure electrical connection with semiconductor chip elements packaged on the printed circuit board, or, in the case of a multilayer printed circuit board, to electrically connect one layer with another.

With the recent demands for high-quality high circuit density products, a high circuit density and high-integrated metal circuitization layer is particularly desired. This can be accomplished by forming a patterned metal circuitization layer from a metal layer. Methods which have been used for formation of a metal circuitization layer can be generally classified into two types; a dry etching method using no solvent, and a wet etching method which is an electrochemical method using solvent. Whichever method is employed, prior to etching, a mask of an organic film, i.e., photoresist, or the like, is formed on a portion of the metal layer which is not intended to undergo etching.

In one dry etching method, etching, for example, sputter etching, is carried out by impinging the metal layer disposed on a substrate on which mask formation is already complete, with ions in a plasma atmosphere. This removes the portion of the metal layer where there is no mask. Specifically, sputtered ions react with the exposed portion of the metal layer to form a compound having a low boiling point, that is, a high vapor pressure, to consequently remove the metal layer. Alternately, the physical force of sputter ions enables the removal of atoms from the metal surface. This method allows etching to have good anisotropy in the direction perpendicular to the substrate surface; therefore it can be suitably used for forming a high circuit density pattern metal circuitization layer. On the other hand, it has disadvantages in that this method has low throughput, high cost and a low etching rate.

In one wet etching method, etching is carried out by contacting a corrosive solvent with the masked metal layer to chemically etch the portion on which there is no mask. Generally copper is employed as a metal layer because of high electric conductivity and good metal plating properties, in which case cupric chloride, ferric chloride, hydrogen peroxide/sulfuric acid mixture and the like can be used as the solvent (etchant). Etchant must be such that it dissolves the metal layer exclusively, but not the mask which can be a metallic or organic resist. One way of contacting etchant with a metal layer is, for example, by first placing an object to be etched inside a tank where etching is to be carried out and then spraying the metal layer with etchant. In order to realize a uniform etching, it is necessary that etchant temperature and composition are appropriately controlled., and the shape of spray nozzle, the spray pressure and the etchant quantity are suitably adjusted and controlled.

Compared to dry etching, wet etching is more suitable for industrial production because it has a higher throughput, and it is employed for various manufacturing processes because it is low in cost. However wet etching is inferior in etching anisotropy in the direction perpendicular to the substrate surface. As a result, wet etching does not necessarily form a high density circuit pattern. The reason is that wet etching is a process of dissolving and removing a metal layer using the chemical action of the etchant. Thus wet etching does not always proceed in the direction perpendicular to the substrate surface. Specifically, wet etching may proceed in the direction parallel to the substrate surface, which causes a patterned metal circuitization layer to have a trapezoidal cross-section rather than a rectangular cross-section. When wet etching is employed as described above, in order to satisfy a specified circuit space it is necessary to increase the circuit space of the design specifications to allow for etching parallel to the plane of the substrate surface. As a result, high circuit density is difficult to achieve with wet etching techniques and circuit line width and spacing cannot be optimized.

Past attempts to solve the problem of etching parallel to the plane of the substrate surface have been unsuccessful. For example, as is shown in FIG. 1, etchant 10 is sprayed on a metal layer 2, which is formed on a substrate 1 and on whose surface a mask 3 is formed having a desired pattern. This causes etching to occur and proceed on a portion 5 which is not covered with the mask 3. This process is, a process where the concentration of metal ions, which are created by a reaction at an interface between the metal layer and etchant, (solid-liquid interface) increases as the reaction proceeds.

In the early stage of etching, while the concentration of metal ions is relatively low, etching will proceed in the direction substantially parallel to the force of spray 10. As is shown in FIG. 2, however, as the concentration of metal ions becomes higher at the solid-liquid interface during the process of etching, the corrosive action of the etchant gets reduced at the portion where concentration of metal ions is higher (the existence of metal ions is stylized and represented by a symbol ○ in the figures). As a result, etching proceeds in a lateral direction (right under the mask) and substantially parallel to the substrate surface where concentration of metal ions is lower. Such a phenomenon is termed side etch. If side etch proceeds in such a way, it may even act on a portion 6 which is not intended to be etched. FIG. 3 shows the shape of a section of the metal layer where etching is complete and the mask 3 is removed. As shown in FIG. 3, the occurrence of side etch causes the circuit layer to have a substantially trapezoid-shaped cross-section.

FIG. 4 shows a more preferred circuit layer having circuit lines with a substantially square shaped or rectangular shaped cross-section. A space 1 between circuit lines is standardized by design, and circuit lines must be formed to meet the standard, for example, the space $1=50$ $\mu$m or more at both the upper and bottom surfaces thereof. Referring to FIG. 3, it is apparent that when a cross-section of the circuit line becomes more rectangular or square-shaped, the circuit lines can meet the preferred condition where space 1 is designed to be $l_0$ ($1=l_0$). On the other hand, in the circuit lines of which the cross-section becomes substantially trapezoid-shaped as shown in FIG. 3, even if their space is designed to have a prescribed value of $l_0$ and the mask is formed to leave a space of $l_0$, the actual space between circuit lines becomes less than $l_0$ ($l_1 < l_0$) and the circuit line density cannot meet the standard. Consequently the circuit layers and the lines therein must be designed so that a space between circuit lines at the bottom of the circuit lines will become $l_0$. Referring to FIG. 3, again it is illustrated that side etching results in a less than optimal density metal circuitization layer because the space of the upper surfaces 12 must be designed to be greater than $l_0$ ($l_2 > l_0$) to meet the circuit line spacing design standard. Accordingly it is very desirable to prevent side etch in the manufacturing of high density circuit layer printed circuit boards.

Various attempts have been made to solve the problem of side etch. For example, Published Unexamined Japanese Patent Application No. 63-153889 discloses a technique of preventing side etch.

According to the technique, a protective coat against side etching is formed on a circuit layer when it has been half etched, then etchant is side-sprayed right down on it to promote etching exclusively in the direction perpendicular to the circuit layer. This method attempts to realize etching in the direction perpendicular to a substrate solely by physical means of spray pressure. A similar technique is also disclosed in Published Unexamined Japanese Patent Application No. 4-66680. The patent application describes that side etch is prevented by spraying etchant on a circuit layer from a short distance and with a relatively high pressure in the early stage of etching. The methods which only use spray with a high pressure, however, are thought to have the following problems.

FIG. 5 is a stylized view showing possible problems of high pressure spraying. First, when spray 20 with a high pressure impacts a metal layer 2, a major portion of its flow takes a turn in the lateral direction and then hits the side of a mask 3 with a relatively high pressure. Consequently it causes deformation 21 in the mask layer, which may allow etching to proceed at some portion of metal layer 2 other than the desired portion. Further it may cause the mask layer to peel off. In addition a problem may also occur in the mask because spray 22 is directed at the surface of mask 3 for a long time. For example, the spray may cause minute pinholes on the surface of the mask, which may lead to the occurrence of etching at some portion of metal layer 2 other than the desired portion.

Other methods may be employed which allow etching to proceed in the direction substantially perpendicular to a substrate, in addition to utilizing physical force, as mentioned above, chemical means may be utilized. For example, Published Unexamined Japanese Patent Application No. 7-22383 discloses an etching method composed of two steps each of which employs etchant having a different composition. In particular, in a first step of the etching method, etchant having a relatively high etching rate is employed. After the etching reaches a prescribed stage, a second etchant of relatively low etching rate is employed. Compared with the method described above which uses spray pressure to cause etching to proceed in the direction substantially perpendicular to a substrate, this method is superior in preventing the occurrence of side etch and maintaining quality, but its drawback is that of a low etching rate.

Accordingly, the present invention makes use of a unique two-step etching process to solve the problem of low etching rate and results in circuit layers being etched into substantially square or rectangular circuit lines.

OBJECTS OF THE INVENTION

It is an object of the present invention to form a high density circuit pattern using a wet etching method.

It is another object of the present invention to provide a-method of carrying out wet etching by preventing the occurrence of side etch.

It is yet another object of the present invention to provide an efficient method of carrying out etching by employing a multistep etching method where etchant is changed at each step.

SUMMARY OF THE INVENTION

The above objects of the present invention are achieved by carrying out etching in the following manner: first, etching is partially done with a first etchant which has a relatively high etching rate, utilizing a spray pressure of zero or a relatively low value; then, etching is completed with a second etchant which has a relatively low etching rate, utilizing a relatively high spray pressure.

In one embodiment of the invention a wet etching method for etching a circuit pattern into a metal layer on a substrate is disclosed. The method comprises the steps of providing a substrate having a metal layer, etching the metal layer at a first pressure with a first etchant having a first etch rate, the first etchant etching in a direction substantially perpendicular to the metal layer, etching the metal layer with a second etchant at a second pressure greater than the first pressure and in a direction substantially perpendicular to the metal layer on the substrate, the second etchant having an etch rate lower than the first etch rate of the first etchant, substantially removing the metal layer by the action of the first etchant and the second etchant and switching from the first etchant to the second etchant before the first etchant can etch the metal layer in a direction substantially parallel to the metal layer.

In another embodiment of the invention an apparatus for wet etching a metal layer on a substrate is disclosed. The metal layer includes an etching mask thereon, describing a prescribed circuit pattern. The apparatus comprises a first device for bringing a first etchant with a first etch rate and a first pressure in contact with the external surface of the metal layer not covered by the etching mask, a second device for bringing a second etchant with a second etch rate and at a second pressure in contact with the surface of the metal layer, the etch rate of the second etchant being lower than the etch rate of the first etchant and the second pressure being higher than the first pressure on the external surface of the metal layer, means for moving the substrate from the first device to the second device before the first etchant can etch the metal layer in a direction substantially parallel to the substrate and means for moving the substrate from the second device when the prescribed circuit pattern is formed within the metal layer.

DETAILED DESCRIPTION OF THE INVENTION

Figure 1:
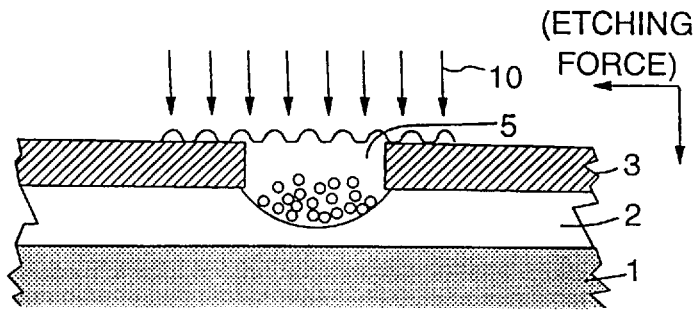
FIG. 1 is a diagram showing a known wet etching process.
Figure 2:
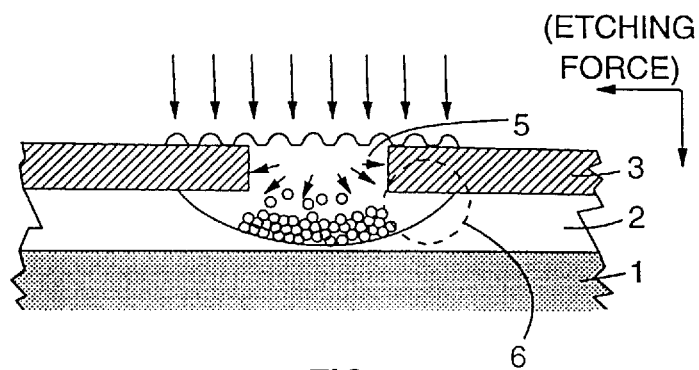
FIG. 2 is a diagram also showing a known wet etching process.
Figure 3:
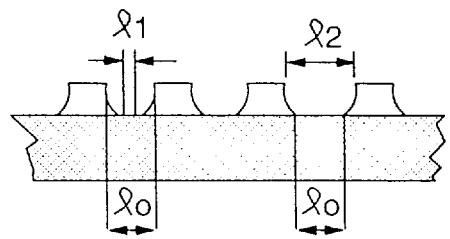
FIG. 3 is a sectional view of a circuit layer obtained by a known wet etching method.

Etching is caused by an eletrochemical reaction between a conductive, preferably a metal, layer and an etchant. The mechanism of etching typically includes the following steps:
(1) diffusion of etchant over the surface of a metal layer (diffusion within fluid film)
(2) adsorption of etchant on the surface of a metal layer (chemical reaction)

(3) formation of a layer of reaction product between etchant and a metal (chemical reaction)

(4) separation of reaction product from the surface of a conductive layer (diffusion within a layer of reaction product)

(5) diffusion of reaction product into etchant (diffusion within fluid film)

A detailed description of the mechanism is found herein. Etchant; reaches the surface of a metal layer via step (1). This step is determined by diffusion. Then etchant that has reached the surface of a metal layer adsorbs on the surface of a metal layer (step (2)). In other words, etchant directly contacts the surface of a metal layer. This is a precondition of the reaction of etchant and a metal. Next a layer of reaction product is formed between the etchant and the metal layer (step (3)). Steps (2) and (3) are chemical reactions, but generally they are not rate-determining steps because they quickly occur at a solid-liquid interface. The compound produced by the reaction between the etchant and the metal layer separates from the metal layer (step (4)). If this separation step (4) does not occur, step (2) never occurs again; therefore etching does not proceed. Upon separation, reaction product diffuses into the etchant. If the diffusion step (5) does not occur, the reaction product which has separated from the metal layer stays over the surface of a metal layer and prevents the further occurrence of step (2).

In light of the above mechanism, it is likely that steps (4) and (5) are rate determining steps of the whole etching reaction. Accordingly, they can be controlled by applying spray pressure.

In the first step of the present invention, etching is carried out using a first etchant having a relatively high etch rate, in which case it is not necessary to apply spray pressure, but a relatively low spray pressure can be applied. When etching is approximately half done in this way, etching is switched to a second etchant having a relatively low etch rate. The switch from the first etchant to the second should occur when the metal ions at the solid-liquid interface reach a high concentration owing to the first etchant reaction and therefore side etch is ready to occur. In the second step of the invention, a relatively high spray pressure is applied so as to compensate for the low etch rate of the second etchant. This facilitates both separation of reaction product staying on the surface of a metal layer (promotion of the above step (4)) and diffusion of the reaction product which has separated from and is staying around the surface into the etchant (promotion of the above step (5)) as well. This combination of etching steps makes it possible to prevent occurrence of side etch, and moreover, facilitates readsorption of etchant on the surface of a metal layer (the above step (2)) and a continuation of the etching reaction (the above step (3)).

Figure 6:
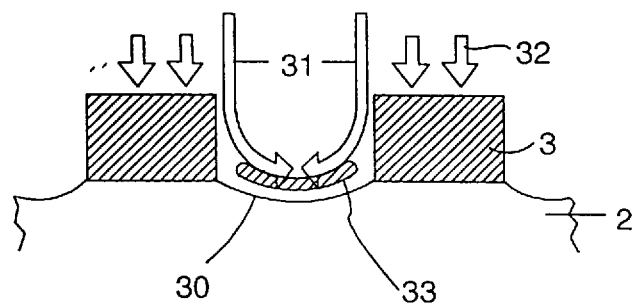
FIGS. 6–11 illustrate the steps of the present invention.

The present invention is characterized in that the surface of a metal layer is etched first in accordance with a first etching step, then in accordance with a second etching step where a high spray pressure is applied. As is shown in FIG. 6, a depression 30 is formed on the surface of a metal layer via the first etching step. Owing to the depression, spray 31, having a high pressure, never hits directly the side surfaces of mask 3. It is illustrated that spray of allows reaction product 33, to stay on the surface of the metal layer and hinders the occurrence of further reaction thereat. Moreover, even though high pressure spray 32 directly impinges on the upper surface of mask 3, the duration of the second etching step can be short enough so as not to materially affect mask 3.

As mentioned above, the present invention is novel in that it is characterized by the application of a high pressure spray in a second etching step. By contrast, existing multistep techniques are performed simply by switching etchant having a high etching rate to etchant having a lower etching rate. Existing techniques do not apply any physical force (which allows reaction product to be removed), in which case etchant is hindered from diffusing over and reaching the surface of a metal layer by reaction product which stays over the surface of a metal layer. Therefore, the etching reaction at the solid-liquid interface substantially declines. In other words, it is hard to control anisotropy and rate of etching simply by chemical action of the etchant. The present invention makes it possible to improve anisotropy and rate of etching remarkably by jointly applying physical force and chemical force.

Figure 7:
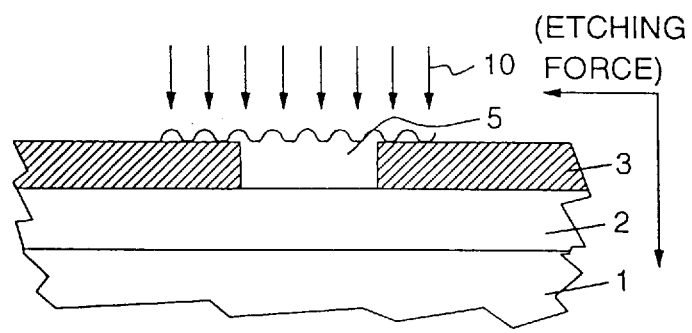

The etching process of the present invention will now be explained in greater detail. FIG. 7 illustrates the initial state of etching. The substrate 1 is a printed circuit board material composed of compound materials, such as glass-epoxy and the like. The substrate 1 has a thin conductive layer such as a metal layer 2 formed thereon. Preferably copper is used for the thin metal layer 2. Mask 3 is so formed as to have a prescribed pattern so that the subsequent desired pattern will be circuitized in the copper layer 2. Generally, resist is used for the mask 3. The mask functions to protect the copper layer thereunder from etching action and consequently it allows the copper layer to have a pattern formed therein. Etchant 10 is so sprayed as to reach the surface of the copper layer. Thus the copper layer surface has a puddle 5 of etchant made thereon. Etchant 10 is selected among various types which can etch the copper layer with relatively strong chemical action. Types of etchants that can be used are, for example, ferric chloride, cupric chloride, sulfuric acid/ hydrogen peroxide and alkali etchant types. Persulfate, and chromic acid/sulfuric acid are also suitable. When metals other than copper are used for the metal layer, the etchant is suitably selected according to background art.

Figure 8:
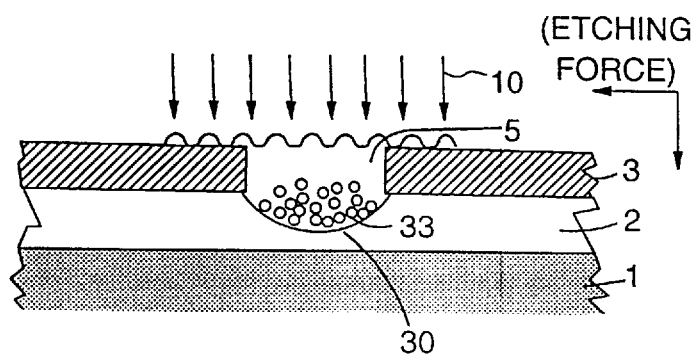

FIG. 8 is a stylized view illustrating the early stage of etching. The surface of the copper layer 2 has a depression 30 formed thereon by etchant having a strong chemical force. The depression 30 has a reaction product layer 33 formed thereon by etching. In the early stage of etching, the amount of reaction product is still small and its layer 33, is thin. In addition the depression is still shallow; therefore the reaction product is easy to diffuse (the above-mentioned step (5)) and etchant 10 is not hindered from reaching the surface of the copper layer (the above mentioned step (1)) by the reaction product. Accordingly etching reaction proceeds in a preferable direction, that is, in the direction substantially perpendicular to the surface of the substrate 1.

In this stage, it is not necessary to apply a high pressure spray although a low pressure spray or even no pressure can be applied. The reason is that etchant is not hindered from reaching the surface of the copper layer 2 because diffusion of reaction product proceeds without a high pressure spray. On the contrary, it could be rather harmful to apply a high pressure spray in this stage. If applied, it may deform the side walls of the resist 3 and cause defects, such as exfoliation of resist 3 and the like. Furthermore if the duration of direct spray on the upper surface of the resist 3 is too long, it may also cause degradation of resist.

Figure 9:
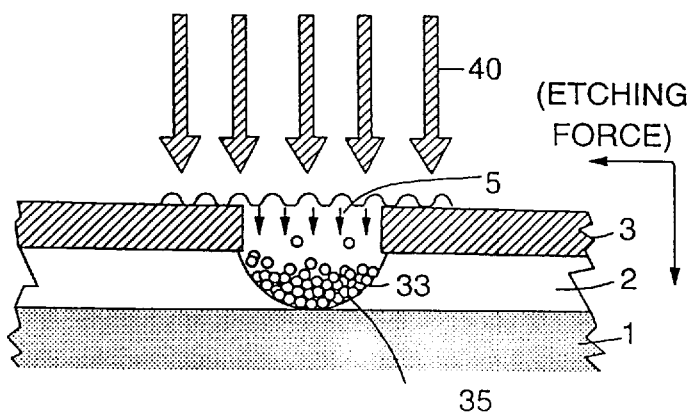

FIG. 9 illustrates the middle stage of etching. In this stage, etching has already proceeded to some degree and reaction product 33 distributes in layers over the surface of copper layer 2. In such a state, it is difficult for further etchant to reach the portion of copper layer 35 under the reaction product. As a result, as mentioned above, etching occurs at the portion close to the mask 3 where the layer of reaction product 33 is relatively thin, which will lead to side etch. Therefore if the etching process continues without interference, side etch occurs and it is impossible to obtain the desired close spacing of the circuit features.

According to the method of the present invention, at this point the initial etchant is switched to a second etchant having a lower etch rate and the spray pressure 40 is initiated or increased (if a low pressure spray is in use). The high pressure spray 40 is intended to impact the surface of the substrate 1 in a direction perpendicular to the substrate 1. The high pressure spray 40 substantially removes reaction product 33 from the surface of the copper layer by physical force, and as a result, effectively helps etchant reach the surface of the copper layer 2. Since the spray 40 has anisotropy perpendicular to the substrate 1, its pressure mainly affects the portion of the surface of the depression parallel to the substrate 1. Thus anisotropy or directionality of the etching becomes better. More particularly, since a high pressure spray does not directly impact the portion of the copper layer closer to the mask, the progress of etching is limited to portions of the copper adjacent to and under the mask 3, that is, side etch can be substantially and effectively prevented.

Switching to an etchant with a lower etch rate at this point substantially minimizes side etch. In particular, after the reaction product layer 33 is removed by the force of the high pressure spray from the bottom surface 35 of the depression formed on the copper layer 2, both the bottom and side surface of the depression are in condition to easily undergo etching. It is very desirable at this point in the process to minimize side etch. Therefore, switching to an etchant with one having a lower etch rate is appropriate.

Figure 4:
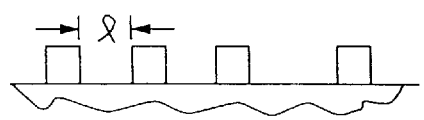
FIG. 4 is a sectional view of a circuit layer obtained by a wet etching method according to the present invention.
Figure 5:
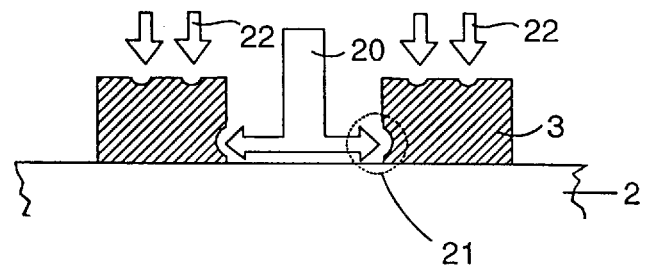
FIG. 5 is a schematic view showing one problem caused by a wet etching method according to background art where a high pressure spray is utilized.

When etching is carried out in this way, occurrence of side etch is substantially prevented, which allows a circuitized layer to have a nearly rectangular or square section as shown in FIG. 4. As mentioned above, the circuitized layer having such a section results in a high circuit density circuit board.

In preferred embodiments of the present invention, etching is carried out through two steps, but it is also possible to carry out etching through three or more steps according to the invention. Even in these cases, according to the objects of the present invention, it is preferable that of all etchant used in the steps, that of the first: step has the highest etch rate and that of the last step the lowest etch rate. Further, with respect to spray pressure applied in each step, it is preferable that the pressure of the first step is the lowest and that of the last step the highest.

Figure 11:
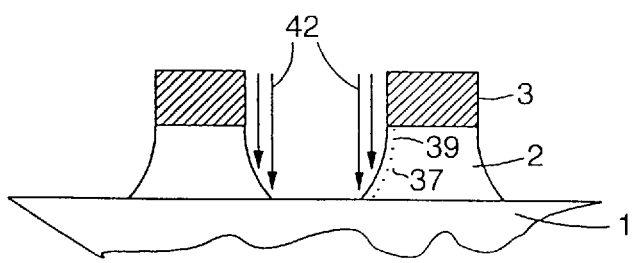

When etching is carried out through three steps, for example, the process may be such that the first two steps are carried out in the same manner as the embodiments of the present invention and in the last step abrasive may be mixed into etchant prior to spray. As is shown in FIG. 11, in the circuit layer 2 formed according to the present invention, its lower part is not always completely perpendicular to a substrate 1, but sometimes forms a slope 37. The use of the etchant having abrasive therein helps to reform the slope 37 into a vertical plane. Specifically, spray 42 containing abrasive directly hits the slope 37 and grinds the slope with its physical and mechanical force in the direction parallel to the spray. Consequently the slope 37 becomes substantially perpendicular to the surface of the substrate. On the other hand, a side surface 39 formed to be a vertical face is not impacted by the spray and free from undergoing a mechanical grinding of abrasive. Thus, in the finishing step of etching, if abrasive is mixed in etchant, it is possible that the side surface of the circuit layer is selectively ground according to its angle with the surface of the substrate by the abrasive sprayed in the direction perpendicular to the surface of the substrate. This allows the whole side surface of the circuit layer to become substantially vertical, and therefore, contributes to the development of a high-density and highly-integrated circuitized layer.

The etchant of the third step is not always required to have a high etch rate, because the reforming effect mentioned above is caused by combining the action of spray pressure and that of abrasive. Further use of etchant containing abrasive should be limited to the finishing step and to a relatively short time, because if the duration of the direct spray of the etchant containing abrasive lasts too long with a high pressure, it may deteriorate the resist 3. Abrasive should be selected among those having a particle size of about 10 $\mu$m, compatible with the circuit materials, such as alumina and silica, and be easy to remove.

Figure 10:
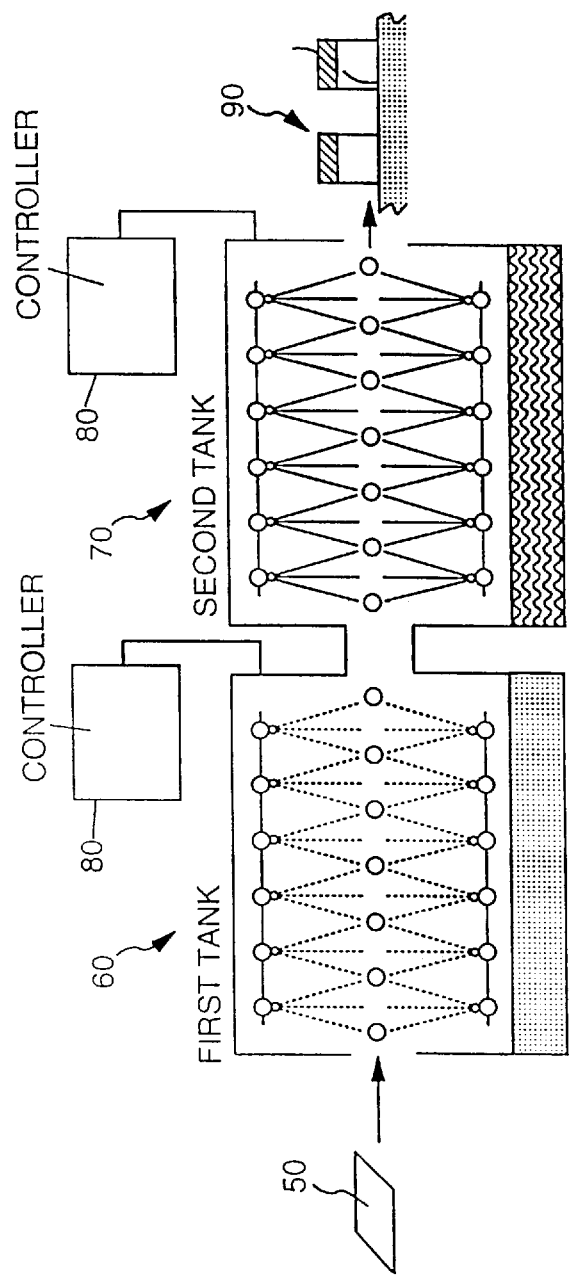

FIG. 10 shows an embodiment in which the present invention is applied to industrial equipment. A substrate 50 having a copper layer, which is an intended object of etching, formed thereon goes through a first tank 60, where a first etching step is carried out, and a second tank 70, where a second etching step is carried out. Parameters such as pressure of spray, composition of etchant and the like are controlled by controllers 80 provided outside the tanks.

In the first step of etching, in tank 60 etchant having a relatively high etch rate is sprayed on the substrate with a relatively low pressure. In the present embodiment, spray pressure is applied, but it other methods such as a dip method and the like are employed, it is not necessary to apply pressure. Residence time, i.e., velocity of the substrate 50 and length of the tank 60 (and tank 70) is determined based on the time required for etching. The etching time depends on various parameters, such as the thickness of a copper layer, temperature, etchant and so on. And etching in this step must be continued just until side etch begins to occur.

Next, the substrate 50 is transferred to the second tank 70 where the second step of etching is carried out. A process of water washing and the like can be added between the first and second tanks, if appropriate. In the second tank, etchant having a lower etch rate than that of the first etchant is sprayed on the surface of the substrate 50 with a higher spray pressure. The etching of the second step is continued until the copper layer is sufficiently removed that the surface of the substrate appears between the copper layers, leaving sufficient space in between to avoid shorts or bridging. Observations made after these processes revealed that the copper layer had a rectangular geometry 90.

EXAMPLE

Now one example of conditions will be shown under which the present invention is to be embodied. The following conditions were applied when it was desired to etch a substrate having a 20 $\mu$m thick copper layer to a 65 $\mu$m desired pitch. Pitch is defined as the spacing between patterned circuit lines. Ferric chloride etchant was used.

|  | (First tank) | (Second Tank) |
| --- | --- | --- |
| Oxidation-reduction Potential | 530 MV | 510 MV |
| Specific gravity | 1.36 | 1.37 |
| Copper concentration | 86 G/L | 93 G/L |
| Etchant temperature | 45 C. | 40 C. |
| Spray pressure | 1.0 KG/CM2 | 3.5 KG/CM2 |
| Conveyance rate | 1.65 M/MIN | 1.65 M/MIN |

MV is millivolts of potential, G/L is grams/liter, C. is degrees Celsius, KG/CM2 is kilograms/centimeter squared and M/Min is meters/minute.

The timing of switching etching from the first tank to the second tank is very important. In the above embodiment, etching of the substrate was carried out in the first tank until the copper layer undergoing etching became about 5 μm thick at its middle, at which time the substrate was switched to the second tank. In terms of the concept of the present invention, timing of switching from the first etchant to the second etchant is when etching obviously starts to proceed in the direction substantially parallel to the surface of the substrate. More particularly, etching must be switched to the second tank when the metal layer to undergo etching becomes about half of its original thickness or less. The timing, however, also depends on various factors, such as cost of etching, required accuracy of etching pattern and so on.

When etchant containing abrasive is used in a finishing etching step, a third tank must be used. In this case, the substrate is switched from the second tank to the third tank when the metal layer undergoing etching becomes about 1 μm thick or less. Preferably it is switched in the very finishing stage, that is, when the metal layer left unetched becomes about 0.2 μm or less so that the resist is not unduly abraded by the action of the abrasive.

Experiments were made on the various parameters. Varied experimental parameters were oxidation-reduction potential which is all index of chemical force of etchant, and spray pressure which is an index of physical force of etching. The higher oxidation-reduction potential is applied, the stronger chemical force becomes, that is, the higher the etch rate becomes. Though etchant temperature also affects the chemical force, it was uniformly fixed at about 45° C. and about 40° C. for the first tank and the second tank, respectively. The experimental results are shown using etching factor (EF) in the following table, where etching factor is an index formularized as EF=2T/L2−L1) when upper base, lower base and height of the circuit layer section are represented by L1, L2 and T, respectively. The more the section forms a well-shaped rectangle or square, the more the value of L2−L1 becomes close to 0, and therefore, the larger the etching factor (EF) becomes.

The following are the data when beginning thickness of the copper layer is 20 μm and the desired pitch is 60 μm.

TABLE 1

| | | E/1/E/2 (mV) | P1/P2 (Kg/cm2) | EF |
|---|---|---|---|---|
| 1 | Embodiment | 530/510 | 0/1 | 9.8 |
| 2 | Embodiment | 530/510 | 0/3 | 9.8 |
| 3 | Embodiment | 530/510 | 0/6 | 9.8 |
| 4 | Comparative example | 530/510 | 2/1 | 6.2 |
| 5 | Embodiment | 530/510 | 2/3 | 9.7 |
| 6 | Embodiment | 530/510 | 2/6 | 10.0 |
| 7 | Comparative example | 530/510 | 3/1 | 6.4 |
| 8 | Embodiment | 530/510 | 3/4 | 9.8 |
| 9 | Embodiment | 530/510 | 3/6 | 9.8 |
| 10 | Comparative example | 530/510 | 4/3 | 6.3 |
| 11 | Comparative example | 530/510 | 4/6 | 8.3 * |
| 12 | Comparative example | 530/510 | 0/7 | 9.9 * |
| 13 | Comparative example | 530/510 | 2/7 | 9.8 * |
| 14 | Comparative example | 490/480 | 2/3 | 6.5 |
| 15 | Embodiment | 500/490 | 2/3 | 9.8 |
| 16 | Embodiment | 520/510 | 2/3 | 9.8 |
| 17 | Embodiment | 520/510 | 2/3 | 9.8 |
| 18 | Embodiment | 540/510 | 2/3 | 9.9 |
| 19 | Embodiment | 550/510 | 2/3 | 9.9 |
| 20 | Comparative example | 570/510 | 2/3 | 7.0 |
| 21 | Embodiment | 530/480 | 2/3 | 9.9 |
| 22 | Embodiment | 530/500 | 2/3 | 9.8 |
| 23 | Embodiment | 530/520 | 2/3 | 9.7 |

TABLE 1-continued

| | | E/1/E/2 (mV) | P1/P2 (Kg/cm2) | EF |
|---|---|---|---|---|
| 24 | Comparative example | 530/470 | 2/3 | 7.3 ** |
| 25 | Embodiment | 550/540 | 2/3 | 9.7 |
| 26 | Embodiment | 560/540 | 2/3 | 9.7 |
| 27 | Comparative example | 570/540 | 2/3 | 6.2 |
| 28 | Comparative example | 560/550 | 2/3 | 6.4 |

\* Resist is broken
\*\* A long time was required

In table 1, E1, E2 represent oxidation-reduction potential in millivolts of the first and second tank, respectively; and P1, P2 spray pressure in kilograms per square centimeter of the first and second tank, respectively.

As is shown in Table 1, the ranges of preferable oxidation-reduction potential (OR) and spray pressure of the present invention are as follows:

| | (First tank) | (Second tank) |
|---|---|---|
| ORP | E1 = 500 – 560 MV | E2 = 480 – 540 MV |
| Spray Pressure | P1 = 0 – 3.0 KG/CM2 | P2 = 1.0 – 6.0 KG/CM2 |

Regarding the preferred range (E1) of ORP in the first tank as shown in comparative examples 14 and 20, when oxidation-reduction potential of the first tank was 490MV and 570MV respectively, the value of etching factor (EF) was remarkably decreased. In determining the preferred range of the spray pressure (P1) in the first tank, comparison of embodiment 9 and comparative embodiment 11, even with P2=6 kg/cm$_2$, demonstrated that a good etching factor (EF) of 9.8 was obtained when P1=3 kg/cm$_2$ as in embodiment 9. On the other hand the etching factor (EF) was decreased to 8.3 in embodiment 11 when P1=4 kg/cm$_2$. In determining the preferred range of ORP (E2) in the second tank, the comparison of embodiment 21 and comparative embodiment 24 demonstrates that even if pressures were very similar to one another, the etching factor (EF) was decreased when the lower limit of E2 was 470 mV (example 24), though it was good when the lower limit of E2 was 480 mV (embodiment 21). Also when oxidation-reduction potential of etchant used in the second tank was reduced too much (i.e. below about 480 MV), etching required a long time as is evident from comparative embodiment 24. Similarly, the upper limit of E2 was determined as 540 mV by comparison of embodiment 26 and comparative embodiment 28. The upper limit of P2 was determined by comparison of embodiment 5 and comparative embodiment 13. The comparison of examples 11–13, where P2 was maintained at 6 kg/Cm$_2$ or above, shows the conditions under which a good etching factor (EF) was obtained, but in these comparative examples there were some problems, such as an abrasion of the resist. The upper end of P2 was therefore determined to be no greater than 6.0 kg/cm$_2$. Note that in example 11 the use of P2=6.0 kg/cm$_2$ resulted in broken resist however P1=4.0 kg/cm$_2$ was outside the prescribed range for the spray pressure in the first tank. Also, when oxidation-reduction potential of etchant used in the second tank was reduced too much, (i.e. before about 480 mV) etching required a long time as is evident from comparative embodiment 24.

Table 2 below shows the range of suitable conditions of the present invention, where not only oxidation-reduction potential and spray pressure are disclosed, but other conditions as well.

TABLE 2

|  | (First tank) | (Second tank) |
|---|---|---|
| ORP | 500–560 Mv | 480–540 MV |
| Specific gravity | 1.20–1.40 | 1.30–1.50 |
| Copper concentration | 70–90 G/L | 80–100 G/L |
| Etchant temperature | 40–60 C. | 30–50 C. |
| Spray pressure | 0–3.0 KG/CM2 | 1.0–6.0 KG/CM2 |
| Conveyance rate | optional | optional |

In the embodiments of the present invention, the layer formed on the substrate is a metal layer. However the present invention can be theoretically applied for etching of a layer composed of materials other than metal, for example, an organic compound layer, a ceramic layer and so on.

According to the present invention, side etch of a metal layer or a substrate is prevented by applying a two-step etching method where a first etching step is carried out using etchant having a high etch rate and then, just before side etching starts, etching is switched to a second one, which is carried out using etchant having a relatively low etch rate. Further, application of a high pressure spray in the second step allows the reaction product formed over the reaction surface of the metal layer to be removed, and in addition, it helps etchant to reach the reaction surface; consequently etching reaction proceeds in the direction perpendicular to the substrate. With all these effects synergistically interacting, the present invention makes it possible to form a circuit layer which has a substantially rectangular or square section and undergoes minimal side etching.

Furthermore, where etchant containing abrasive is used in the very finishing stage (this finishing step can be the second etching step or subsequent etching steps), the present invention makes it possible for the whole side surface of a circuit layer to be substantially perpendicular to the substrate by mechanically grinding the remaining sloped portion of the circuit layer, which cannot be removed in a first and/or second steps of etching (without abrasives), and therefore makes it possible to obtain a patterned circuitized layer having a substantially rectangular or square section.

While the invention has been described with respect to certain preferred embodiments and exemplifications, it is not intended to limit the scope of the invention thereby, but solely be the claims appended hereto.

I claim:

1. A method for wet etching a circuit pattern into a metallayer on a substrate, said method comprising the steps of:
    providing a substrate having a metal layer thereon;
    etching a first part said metal layer at a first pressure with a first etchant having a first etch rate, said first etchant etching in a direction substantially perpendicular to said metal layer;
    etching a second part of said metal layer with a second etchant at a second pressure greater than said first pressure and in a direction substantially perpendicular to said metal layer on said substrate before said first etchant can etch said metal layer in a direction substantially parallel to said metal layer, said second etchant having an etch rate lower than said first etch rate of said first etchant; and
    said etching by said first and second etchants substantially removing said first and second parts of said metal layer to define a circuit pattern on said substrate.

2. The method for wet etching according to claim 1 further comprising a step of etching a third part of said metal layer with a third etchant, said third etchant having an etch rate, lower than said etch rate of said second etchant and being sprayed on said metal layer by applying a third pressure in the direction substantially perpendicular to said metal layer, said third pressure being higher than said second pressure of said second etchant.

3. The method for wet etching according to claim 2, wherein an abrasive is mixed in said second etchant and/or said third etchant.

4. The method for wet etching according to claim 1, wherein said metal layer is etched with said first etchant having said first pressure of up to about 3.0KG/CM$^2$.

5. The method for wet etching according to claim 1, wherein said metal layer is etched with said second etchant having said second pressure of about 1.0 to about 6.0KG/CM$^2$.

6. The method for wet etching according to claim 1 further comprising:
    forming a patterned etching mask on said metal layer on said substrate, thereby exposing a portion of said metal layer;
    applying said first etchant at said first pressure;
    forming at least one depression on said portion of said metal layer exposed by said etching mask, said depression having an inner surface and a side surface;
    substantially removing reaction products formed by reaction of said metal layer and said first etchant from said inner surface and said side surface of said depression in said metal layer by the action of said second etchant having said second pressure greater than said first pressure imposed thereon; and
    etching said metal layer with a third etchant, said third etchant having an etch rate lower than that of said second etchant, said third etchant being sprayed on said metal layer by applying a third pressure in a direction substantially perpendicular to said metal layer, said third pressure being higher than said second pressure of said second etchant.

7. The method for wet etching according to claim 1, wherein abrasive is mixed in with said third etchant.

8. The method for wet etching according to claim 7, wherein said side surface of said depression in said metal layer is impacted by said abrasive in a direction substantially perpendicular to said metal layer on said substrate, to thereby be mechanically and selectively ground such that an angle is formed between said side surface of said depression and said substrate, said angle being substantially perpendicular.

9. An apparatus for wet etching a metal layer on a substrate wherein said metal layer includes an etching mask thereon defining a prescribed circuit pattern, said apparatus comprising:
    a first device for bringing a first etchant with a first etch rate and at a first pressure in contact with said external surface of said metal layer not covered by said etching mask;
    a second device for bringing a second etchant with a second etch rate and at a second pressure in contact with the surface of said metal layer, said etch rate of said second etchant being lower than said etch rate of said first etchant and said second pressure being higher than said first pressure on said external surface of said metal layer;
    means for moving said substrate from said first device to said second device before said first etchant can etch said metal layer in a direction substantially parallel to said substrate; and means for moving said substrate from said second device when said prescribed circuit pattern is formed within said metal layer.

10. The apparatus of claim 9, wherein said first device comprises a first tank including pressure devices therein, for bringing said first etchant with said first etch rate at said first pressure in contact with said external surface of said metal layer.

11. The apparatus of claim 10, wherein said pressure devices comprise sprayers.

12. The apparatus of claim 9, wherein said second device comprises a second tank including pressure devices for bringing said second etchant with said second etch rate at said second pressure in contact with said external surface of said metal layer.

13. The apparatus of claim 12, wherein said pressure devices comprise sprayers.

* * * * *